United States Patent
Hashimoto et al.

[11] Patent Number: 6,048,648
[45] Date of Patent: Apr. 11, 2000

[54] MASK INCLUDING OPTICAL SHIELD LAYER HAVING VARIABLE LIGHT TRANSMITTANCE

[75] Inventors: Shuichi Hashimoto; Masashi Fujimoto, both of Tokyo, Japan

[73] Assignee: NEC Corporation, Tokyo, Japan

[21] Appl. No.: 09/037,362

[22] Filed: Mar. 10, 1998

[30] Foreign Application Priority Data

Mar. 10, 1997 [JP] Japan ................................. 9-054940

[51] Int. Cl.⁷ ............................................. G03F 9/00
[52] U.S. Cl. ............................................. 430/5
[58] Field of Search ................. 430/5, 322, 323, 430/324

[56] References Cited

U.S. PATENT DOCUMENTS 5,318,868  6/1994  Hasegawa et al. ................. 430/5
5,490,896  2/1996  Yagi et al. ......................... 430/5

FOREIGN PATENT DOCUMENTS 06-123961  6/1995  Japan ............................. G03F 1/08
07-209850  8/1995  Japan ............................. G03F 1/08

Primary Examiner—S. Rosasco
Attorney, Agent, or Firm—Hayes Soloway Hennessey Grossman & Hage PC

[57] ABSTRACT

In a mask including an optical shield layer formed on a transparent substrate, the light transmittance of the shield layer is changed in accordance with the density of patterns of the shield layer or the thickness of a photoresist layer on a semiconductor substrate.

9 Claims, 10 Drawing Sheets

1

MASK INCLUDING OPTICAL SHIELD LAYER HAVING VARIABLE LIGHT TRANSMITTANCE

BACKGROUND OF THE INVENTION

1. Field of the Invention

The present invention relates to a mask such as a photomask or a reticle used for manufacturing a semiconductor device.

2. Description of the Related Art

In an integrated circuit semiconductor device such as a dynamic random access memory (DRAM) device, the integration has been developed, so that the width of lines of patterns in a photolithography process has become very fine.

In a prior art photolithography process, if a photomask has a line-and-space pattern and an isolated pattern, the width of each line of the line-and-space pattern is the same as that of the isolated pattern. As a result, a difference in width of images of lines is generated between the line-and-space pattern and the isolated pattern, which is called an optical proximity effect. This will be explained later in detail.

In another prior art photolithography process for a photoresist layer formed on a semiconductor substrate, even if the thickness of the photoresist layer is uneven, a photomask is formed by patterns having the same line width. As a result, a difference in width of images of lines is generated between regions where photoresist layers having different thickness are formed, which is called a standing wave effect. This will be explained later in detail.

In the prior art, the optical proximity effect and the standing wave effect are both diminished by a mask bias method which applies bias to patterns.

In the mask bias method, however, it is difficult to manufacture a photomask having patterns including optimum bias amounts, particularly, when the patterns are more refined.

SUMMARY OF THE INVENTION

It is an object of the present invention to provide a mask capable of diminishing the optical proximity effect and the standing wave effect without adopting the mask bias method.

According to the present invention, in a mask including an optical shield layer formed on a transparent substrate, the light transmittance of the shield layer is changed in accordance with the density of patterns of the shield layer or the thickness of a photoresist layer on a semiconductor substrate.

BRIEF DESCRIPTION OF THE DRAWINGS

The present invention will be more clearly understood from the description as set forth below, as compared with the prior art, with reference to the accompanying drawings, wherein.

DESCRIPTION OF THE PREFERRED EMBODIMENTS

Before the description of the preferred embodiments, the optical proximity effect and the standing wave effect will be explained with reference to FIGS. 1, 2, 3 and 4.

Figure 1:
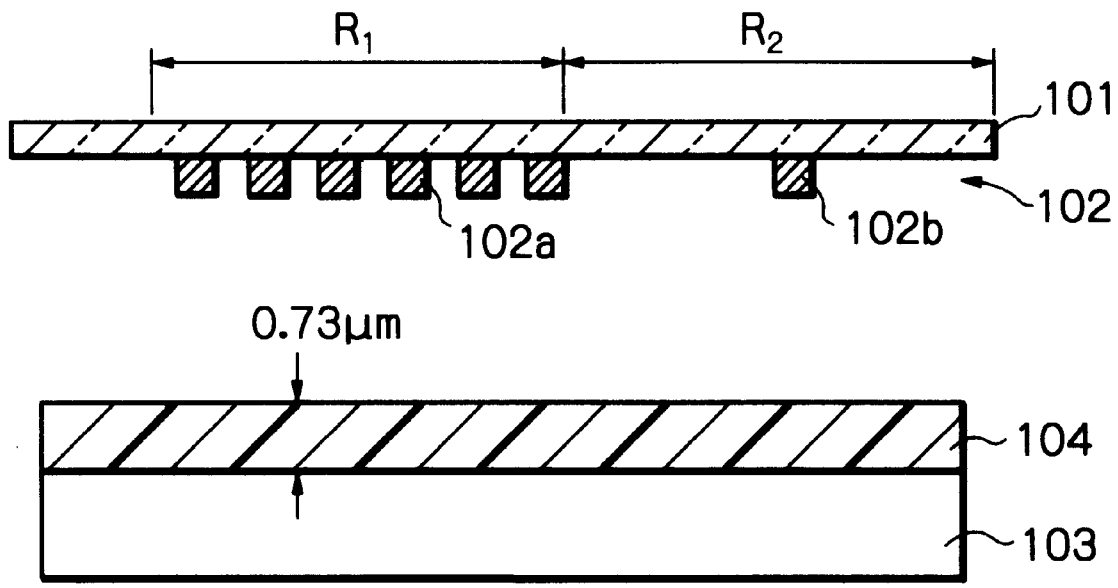
FIG. 1 is a cross-sectional view illustrating a prior art photomask.
Figure 2:
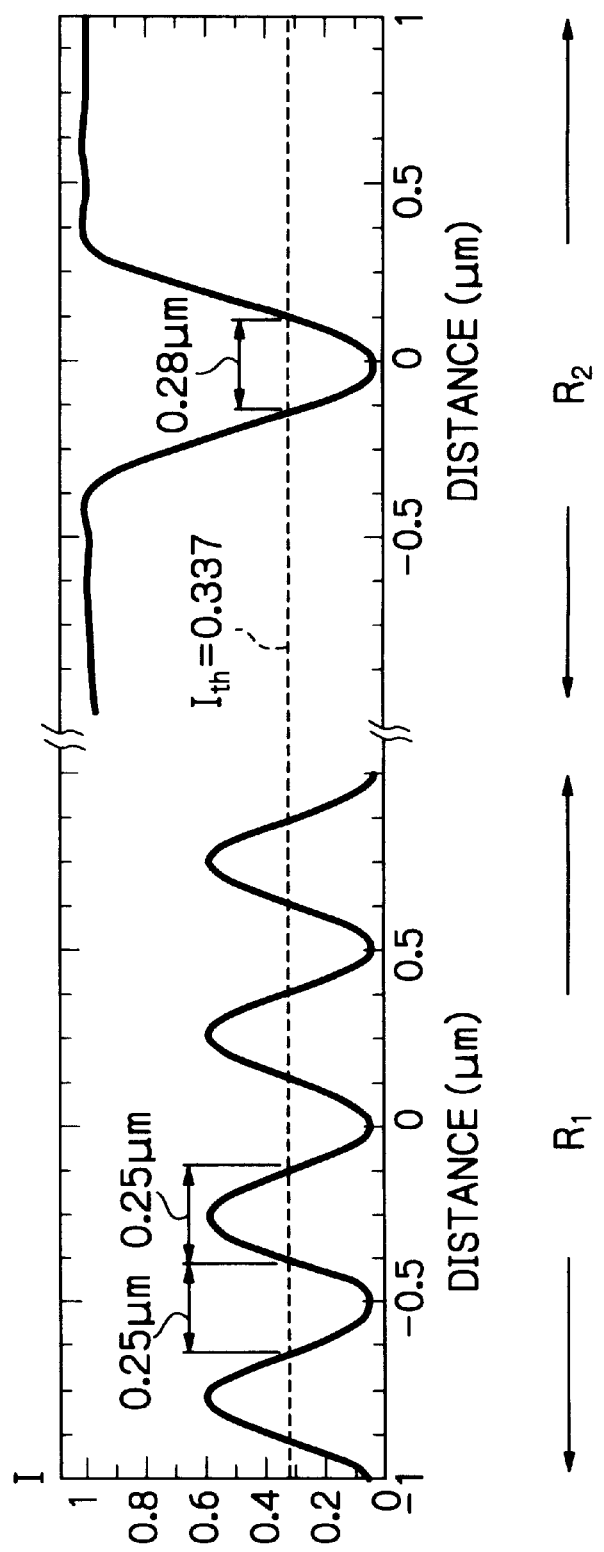
FIG. 2 is a graph showing the light strength characteristics on the photoresist of FIG. 1.

FIGS. 1 and 2 are diagrams for explaining the optical proximity effect. Note that FIG. 1 illustrates a photomask and a semiconductor device, and FIG. 2 shows a graph showing a light intensity distribution on the semiconductor device obtained when a reduction projection exposure is carried out by using the photomask of FIG. 1.

In FIG. 1, the photomask is constructed by a glass substrate 101 and an optical shield layer 102 made of chromium (Cr) formed on the glass substrate 101. Note that Cr has a light transmittance of 0 percent per $\mu$m. The optical shield layer 102 has a fine pattern 102a in a region $R_1$ and a coarse pattern 102b in a region $R_2$. In the fine pattern 102a, the width of each line is the same as that of each space between the lines. Also, in the coarse pattern 102b, the width of an isolated line is the same as that of the lines of fine pattern 102a.

Also, the semiconductor device is constructed by a semiconductor substrate 103 and a photoresist layer 104 deposited on the semiconductor substrate 103 via an insulating layer (not shown). The photoresist layer 103 is made of positive type photoresist having a light transmittance of about 50 percent per $\mu$m, for example. In this case, the thickness of the photoresist layer 104 is approximately uniform, and is about 0.73, $\mu$m, for example.

If a reduction projection exposure is carried out by using the photomask of FIG. 1 under an optical condition that NA=0.5, $\sigma$=0.7 and $\lambda$=240 nm where NA is a numerical aperature, $\sigma$ is a coherency of a light source and $\lambda$ is a wavelength of a KrF excimer laser of the light source, a light strength distribution as shown in FIG. 2 is obtained. In FIG. 2, a threshold light strength $I_{th}$ is defined so that the width of an image of each line of the fine pattern 102a is the same as that of an image of each space of the fine pattern 102a. In this case, such width is about 0.25, $\mu$m, and $I_{th}$ is 0.337. On the other hand, the width of an image of the isolated line of the coarse pattern 102b is about 0.28 $\mu$m on the basis of the threshold light strength $I_{th}$. Thus, a difference such as 0.03 $\mu$m (=0.28, $\mu$m–0.25 $\mu$m) in width images of lines is generated between the regions $R_1$ and $R_2$, which is called an optical proximity effect.

In the prior art, the optical proximity effect is diminished by a mask bias method which applies a bias to patterns.

Figure 3:
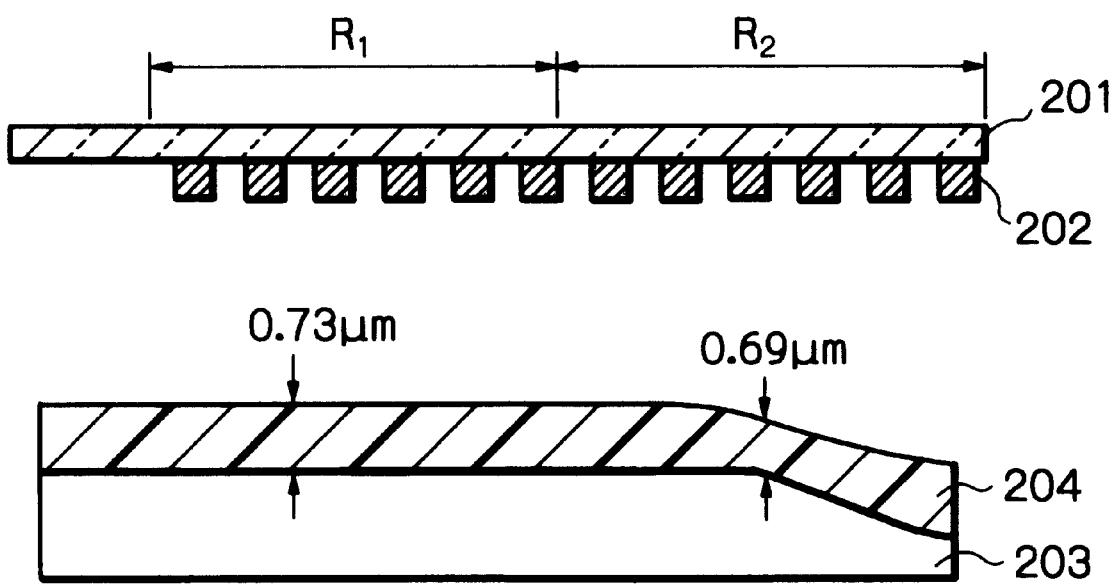
FIG. 3 is a cross-sectional view illustrating another prior art photomask.
Figure 4:
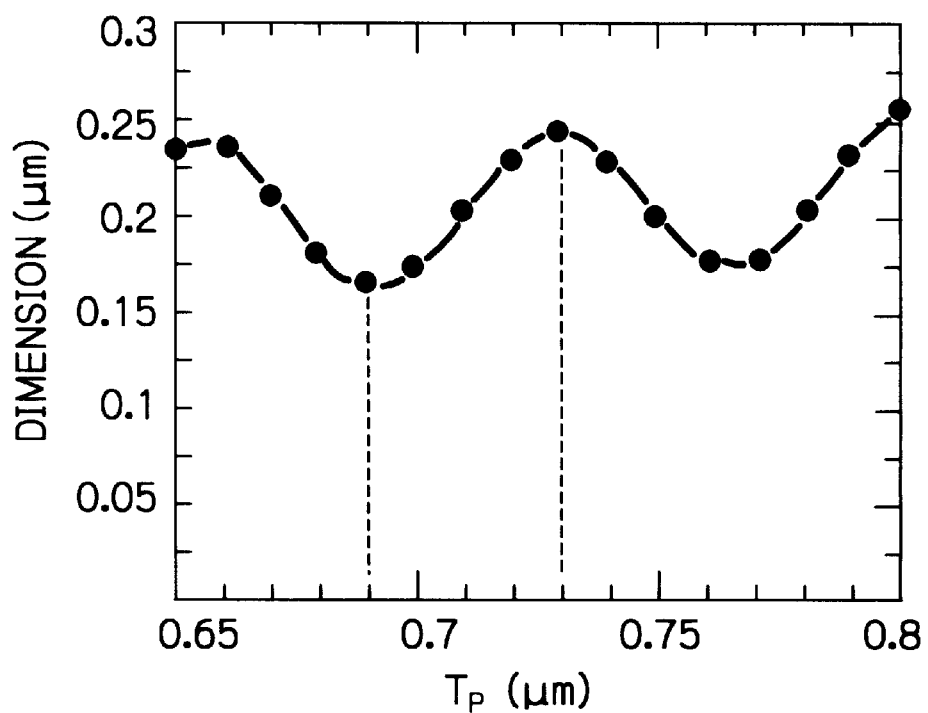
FIG. 4 is a graph showing the dimension characteristics of a line image on the photoresist of FIG. 3.

FIGS. 3 and 4 are diagrams for explaining the standing wave effect. Note that FIG. 3 illustrates a photomask and a semiconductor device, and FIG. 4 shows a dimension of an image obtained on the semiconductor device when a reduction protection exposure is carried out by using the photomask of FIG. 1.

In FIG. 3, the photomask is constructed by a glass substrate 201 and an optical shield layer 202 made of $C_r$ formed on the glass substrate 201. The optical shield layer 202 has a fine pattern in both regions $R_1$ and $R_2$. That is, the width of each line is the same as that of each space between the lines.

Also, the semiconductor device is constructed by semiconductor substrate 203 and a photoresist layer 204 formed on the semiconductor substrate 203 via an insulating layer (not shown). The photoresist layer 203 is made of positive type photoresist having a light transmittance of about 50 percent per $\mu$m, for example. In this case, since the photoresist layer 204 is generally spin-coated, the thickness of the photoresist layer 204 fluctuates. For example, the thickness of the photoresist layer 204 is about 0.73 $\mu$m In a region $R_1$, and the thickness of the photoresist layer 204 is about 0.69 $\mu$m in a region $R_2$.

If a reduction projection exposure is carried out by using the photomask of FIG. 3 under an optical condition that NA=0.5, σ=0.7 and λ=240 nm, a dimension of an image of each line is dependent upon the thickness $T_p$ of the photoresist layer 204, as shown in FIG. 4. That is, in the region $R_1$ the thickness of the photoresist layer 204 is about 0.73 $\mu$m, so that the dimension of an image of each line is about 0.25 $\mu$m. On the other hand, in the region $R_2$, the thickness of the photoresist layer 204 is about 0.69 $\mu$m, so that the dimension of an image of each line is about 0.17 $\mu$m. For example, in a DRAM device, a photoresist layer is thinner in a boundary between a cell array area and a peripheral circuit area due to the generation of a stepped portion. Thus, a difference in width of images of lines between the regions $R_1$ and $R_2$ is generated, which is called a standing wave effect.

In the prior art, the standing wave effect is also diminished by a mask bias method which applies a bias to patterns.

The principle of the present invention is explained next with reference to FIGS. 5, 6A, 6B, 6C, 6D and 7.

Figure 5:
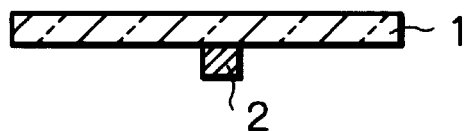
FIG. 5 is a cross-sectional view for explaining the principle of the present invention.
Figure 5:
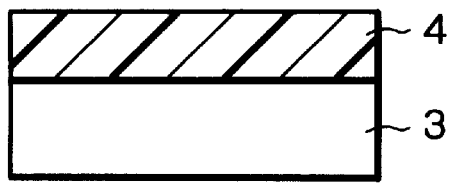
Figure 6A:
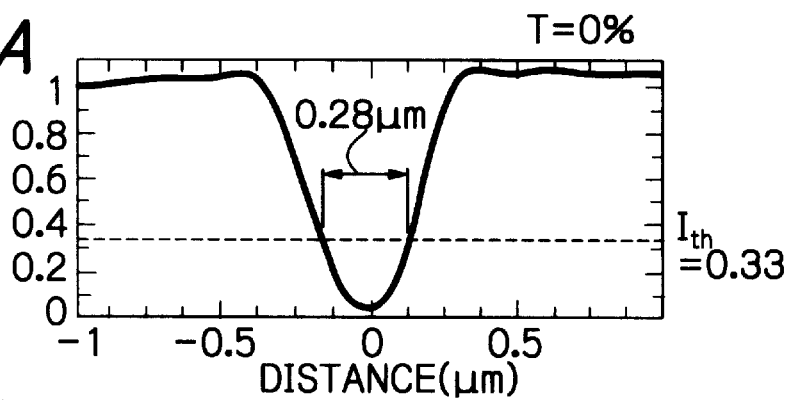
FIGS. 6A, 6B, 6C and 6D are graphs showing the light strength characteristics on the photoresist of FIG. 5.
Figure 6B:
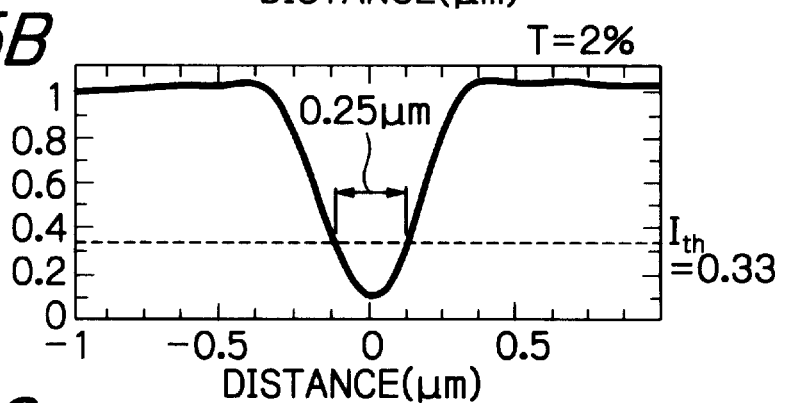
Figure 6C:
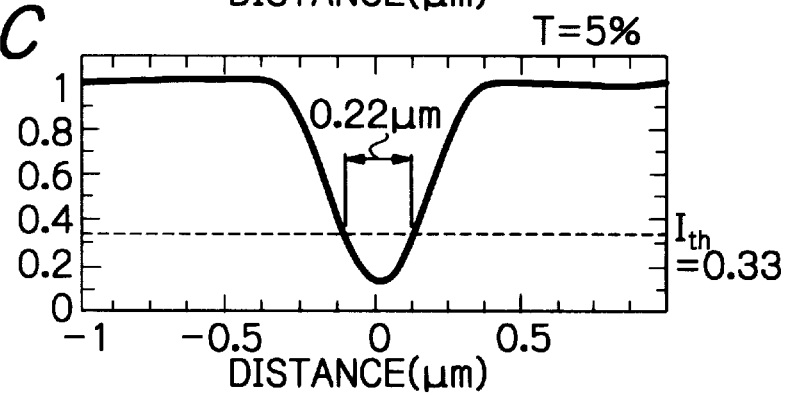
Figure 6D:
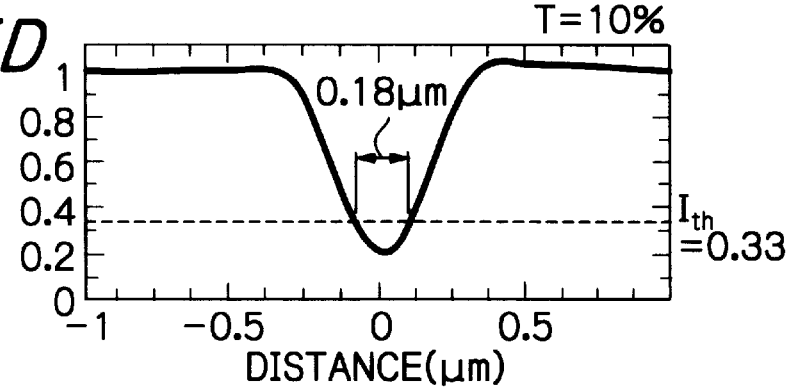

In FIG. 5, which illustrates a photomask and a semiconductor device, the photomask is constructed by a glass substrate 1 and an optical shield pattern 2 formed on the glass substrate 1. In this case, the optical shield pattern 2 is composed of an isolated line having a width of 0.25, $\mu$m. Also, the semiconductor device is constructed by a semiconductor substrate 3 and a photoresist layer 4 formed on the semiconductor substrate 3 via an insulated layer (not shown).

If a reduction projection exposure is carried out by using the photomask of FIG. 5 under an optical condition that NA=0.5, σ=0.7 and λ=240 nm, light strength distributions are obtained as shown in FIGS. 6A, 6B, 6C and 6D where the light transmittance T of the optical shield pattern 2 is 0%, 2%, 5% and 10%, respectively. In this case, the threshold light strength $I_{th}$ (=0.337) is the same as defined by a 0.25 $\mu$m fine pattern 102a of FIGS. 1 and 2. That is, the larger the light transmittance T of the optical shield pattern 2, the smaller the width W of a line image of the optical shield pattern 2. The relationship between the light transmittance T and the width W of the line image of the optical shield pattern 2 is shown in FIG. 7.

Figure 7:
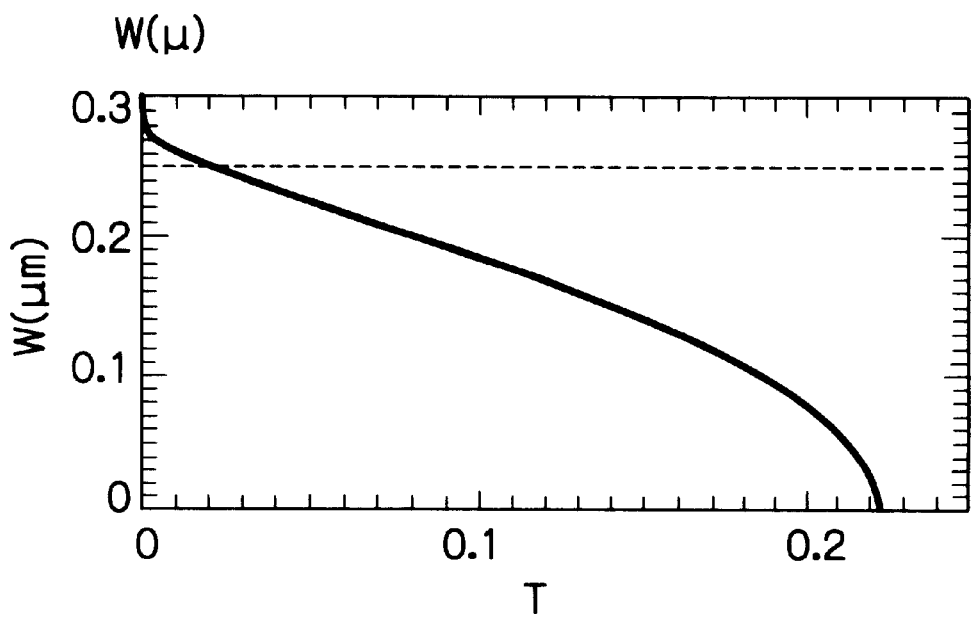
FIG. 7 is a graph showing the dimension characteristics of a line image on the photoresist of FIG. 5.

From FIG. 7, if the light transmittance T of the optical shield pattern 2 is approximately 2 percent, the width of the line image is approximately 0.25 $\mu$m which is the same as that of the image of each of the lines and space of the fine pattern 102a of FIGS. 1 and 2.

Figure 8:
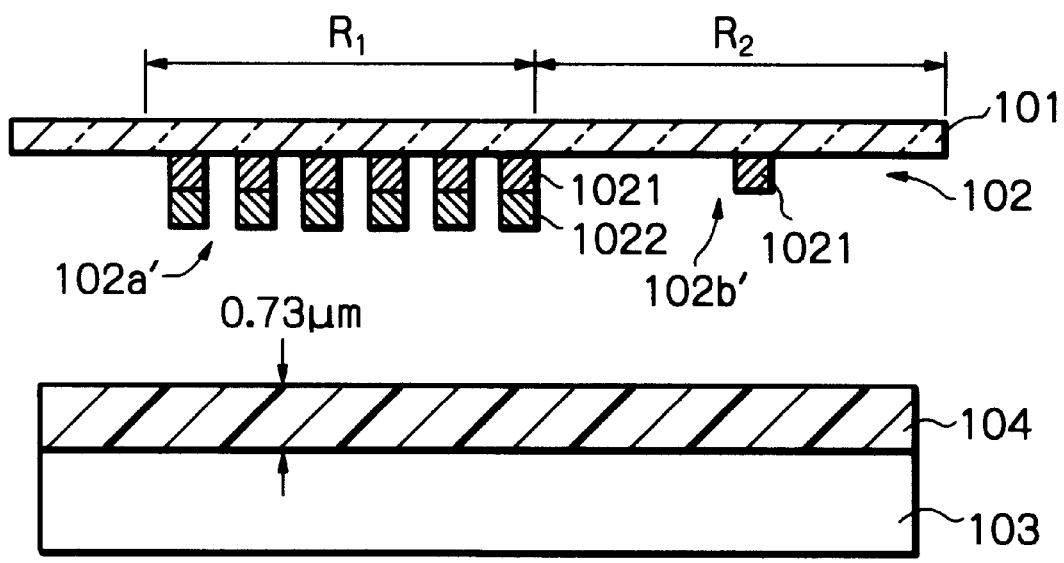
FIG. 8 is a cross-sectional view illustrating a first embodiment of the photomask according to the present invention.

In FIG. 8, which illustrates a first embodiment of the present invention, the optical shield layer 102 of FIG. 1 is replaced by an optical shield layer 102' which is formed by a molybdenum silicon (MoSi) layer 1021 and a Cr layer 1022. Note that the MoSi layer 1021 is translucent, while the Cr layer 1022 is opaque. That is, a fine pattern 102 a' is formed by the MoSi layer 1021 and the Cr layer 1022, so that the light transmittance T of the fine pattern 102a' is 0 percent. On the other hand, a coarse pattern 102b' is formed by only the MoSi layer 1021, so that the light transmittance T of the coarse pattern 102b' is approximately 2 percent, for example.

Figure 9:
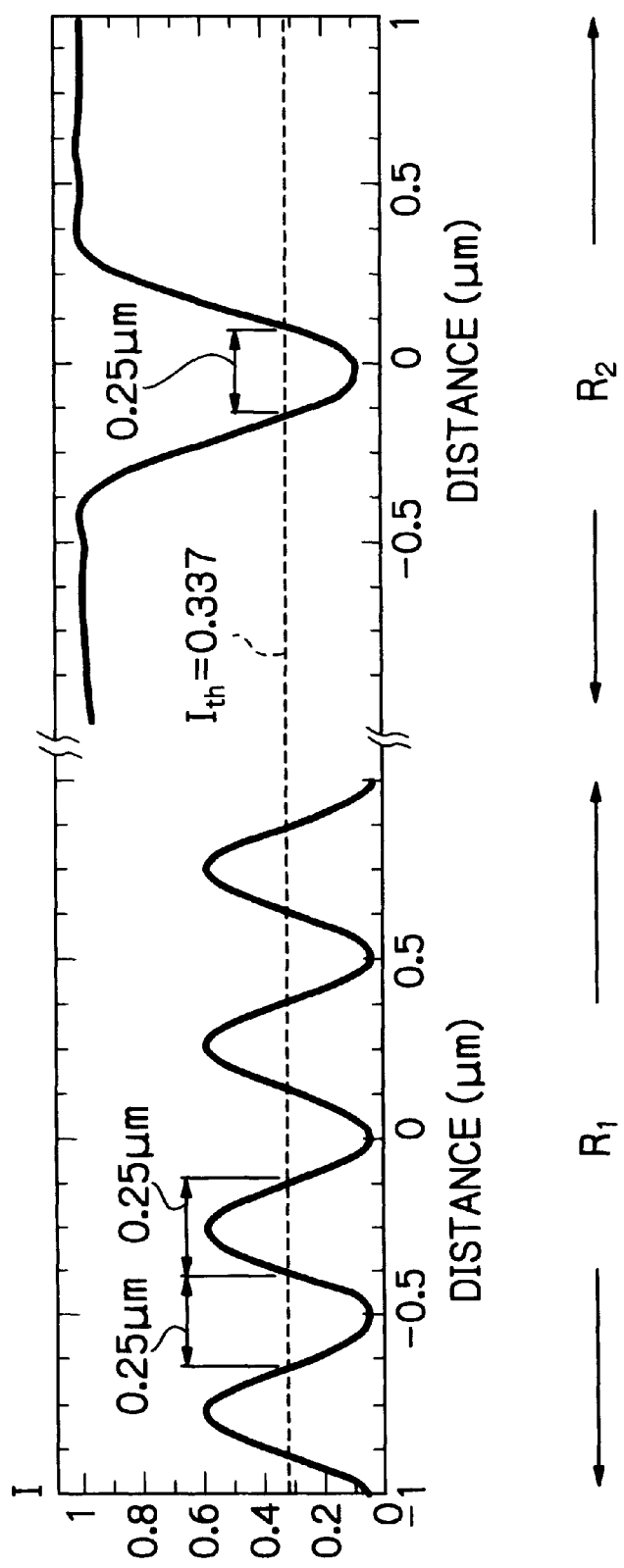
FIG. 9 is a graph showing the light strength characteristics on the photoresist of FIG. 8.

If a reduction projection exposure is carried out by using the photomask of FIG. 8 under an optical condition that NA=0.5, σ=0.7 and λ=240 nm where NA is a numerical aperature, σ is a coherency of a light source and λ is a wavelength of KrF excimer laser of the light source, a light strength distribution as shown in FIG. 9 is obtained. In FIG. 9, the width of an image of the isolated line of the coarse pattern 102b' is about 0.25 $\mu$m on a basis of the threshold light strength $I_{th}$ (=0.337). Thus, no difference in width images of lines is generated between the regions $R_1$ and $R_2$. As a result, the optical proximity effect is compensated for.

Figure 10:
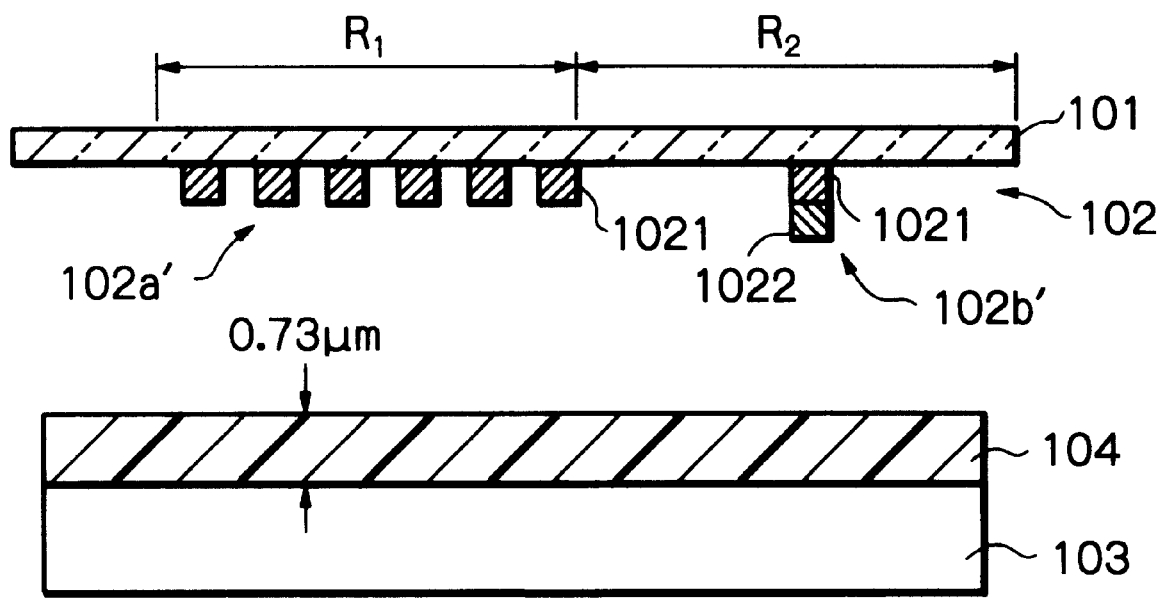
FIG. 10 is a cross-sectional view illustrating a modification of the photomask of FIG. 8.

In FIG. 8, it is assumed that the width of an image of the isolated line of the fine pattern 102a' in the region $R_2$ is larger than that of an image of the line of the coarse pattern 102b' in the region $R_1$ under the same condition that the fine patterns 102a' and 102b' are made of only Cr. However, if the width of an image of the isolated line of the fine pattern 102a' in the region $R_2$ is smaller than that of an image of the line of the coarse pattern 102b' in the region $R_1$ under a condition different from the above-mentioned condition, the photomask of FIG. 8 can be replaced by a photomask as illustrated in FIG. 10. In FIG. 10, the fine pattern 102a' is formed by only the MoSi layer 1021, so that the light transmittance T of the fine pattern 102a' is approximately 2 percent, for example. On the other hand, the coarse pattern 102b' is formed by the MoSi layer 1021 and the Cr layer 1022, so that the light transmittance T of the coarse pattern 102b' is 0 percent.

Figure 11:
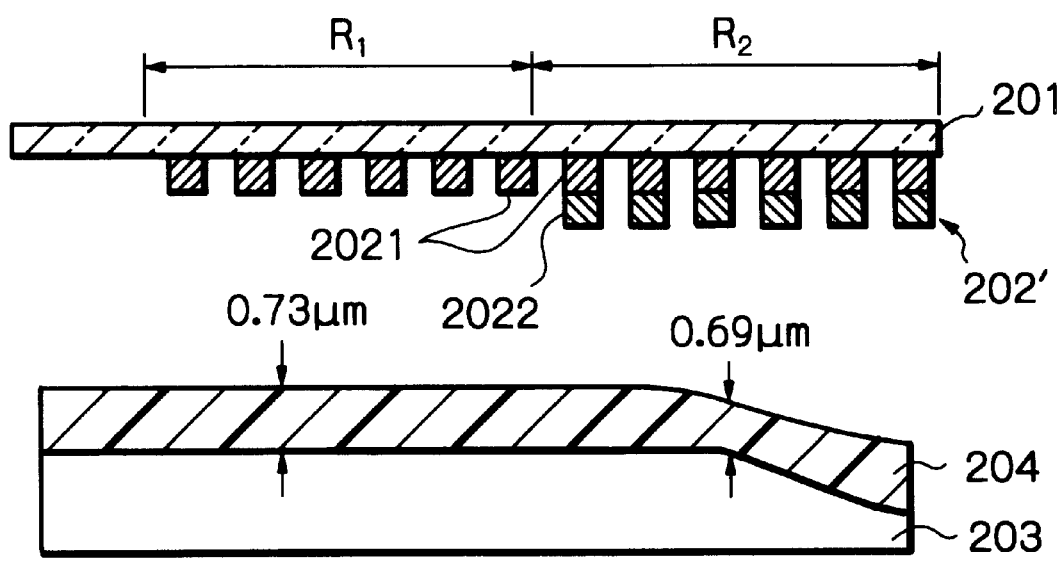
FIG. 11 is a cross-sectional view illustrating a second embodiment of the photomask according to the present invention.

In FIG. 11, which illustrates a second embodiment of the present invention, the optical shield layer 202 of FIG. 3 is replaced by an optical shield layer 202' which is formed by a translucent MoSi layer 2021 and an opaque Cr layer 2022. That is, the optical shield layer 202' in the region $R_1$ is formed by only the MoSi layer 2021, so that the light transmittance T of the optical shield layer 202' in the region $R_1$ is approximately 18 percent, for example. On the other hand, the optical shield layer 202' in the region $R_2$ is formed by the MoSi layer 2021 and the Cr layer 2022, so that the light transmittance T of the optical shield layer 202' in the region $R_2$ is 0 percent.

If a reduction projection exposure is carried out by using the photomask of FIG. 11 under an optical condition that NA=0.5, σ=0.7 and λ=240 nm, a dimension of an image of each line is dependent upon the light transmittance T of the optical shield layer 202' as well as the thickness $T_p$ of the photoresist layer 204 as shown in FIG. 4. That is, in the region $R_1$, the thickness of the photoresist layer 204 is about 0.73 $\mu$m, so that the dimension of an image of each line is about 0.25 $\mu$m in view of only the thickness $T_p$ of the photoresist layer 204. However, in this case, since the light transmittance T of the optical shield layer 202' is approximately 18 percent, the dimension of the image of each line is reduced to about 0.17 $\mu$m (see FIG. 7). On the other hand, in the region $R_2$, the thickness of the photoresist layer 204 is about 0.69 $\mu$m, so that the dimension of an image of each line 15 is about 0.17 μm (see FIG. 4). Thus, no difference in width of image of lines is generated between the regions $R_1$ and $R_2$. As a result, the standing wave effect is compensated for.

Figure 12:
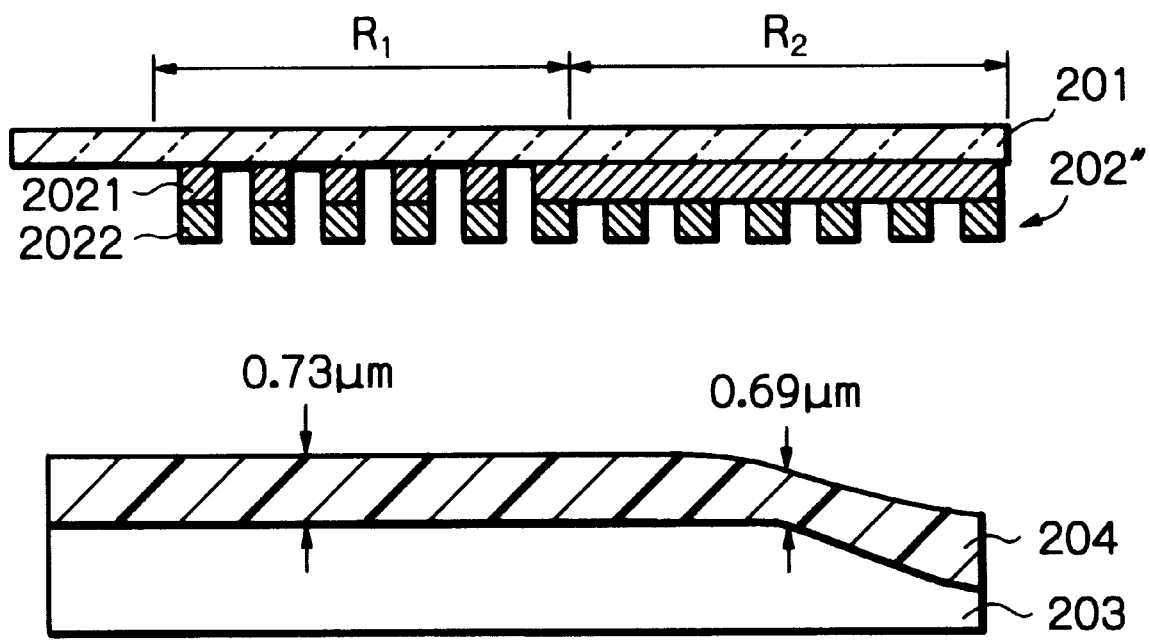
FIG. 12 is a cross-sectional view illustrating a third embodiment of the photomask according to the present invention.

In FIG. 12, which illustrates a third embodiment of the present invention, the optical shield layer 202 of FIG. 3 is replaced by an optical shield layer 202" which is formed by a translucent MoSi layer 2021 and an opaque Cr layer 2022. That is, the optical shield layer 202" in the region $R_1$ is formed by the Cr layer 2022, so that the light transmittance T of the optical shield layer 202" in the region $R_1$ is 0 percent. On the other hand, in the optical shield layer 202" in the region $R_2$, each line is formed by the MoSi layer 2021 and the Cr layer 2022 and each space is formed by only the MoSi layer 2021. As a result, the light transmittance T of each line is 0 percent, and the light transmittance T of each space is approximately 55 percent.

If a reduction projection exposure is carried out by using the photomask of FIG. 12 under an optical condition that NA=0.5, σ=0.7 and λ=240 nm, a dimension of an image of each line is dependent upon the light transmittance T of the optical shield layer 202" as well as the thickness $T_p$ of the photoresist layer 204 as shown in FIG. 4. That is, in the region $R_1$, the thickness of the photoresist layer 204 is about 0.73 μm, so that the dimension of an image of each line is about 0.25 μm in view of only the thickness $T_p$ of the photoresist layer 204. On the other hands, in the region $R_2$, the thickness of the photoresist layer 204 is about 0.69 μm, so that the dimension of an image of each line is about 0.17 μm (see FIG. 4). However, in this case, since the MoSi layer 2021 is provided in each space, the dimension of the image of each space is reduced, so that the dimension of the image of each line is increased from 0.17 μm to 0.25 μm, for example (see FIG. 7). Thus, no difference in width of images of lines is generated between the regions $R_1$ and $R_2$. As a result, the standing wave effect is compensated for.

Note that the translucent layer 1021 (2021) can be made of material other than MoSi, and the opaque layer 1022 (2022) can be made of material other than Cr.

Also, in the first embodiment, the photomask can be replaced by a reticle, and the semiconductor device can be replaced by a photomask.

Further, the present invention can be used in a stepper, a direct projection exposure apparatus or a scanning-type exposure apparatus.

As explained hereinabove, since an optical shield layer is constructed by an opaque layer and a translucent layer so that the dimension of an image of a line is changed, the optical proximity effect and the standing wave effect can be compensated for.

We claim:

1. A mask comprising:

a transparent substrate; and an optical shield layer formed on said transparent substrate, for producing a photographic exposure of an image of a line having a desired width dimension, the width dimension of the image exposed through said mask decreasing with both increasing density of neighboring lines and increasing transmittance of the shield layer forming said line image, the light transmittance of said shield layer being changed in accordance with a density of patterns of said shield layer.

2. The mask as set forth in claim 1, being a photomask.

3. The mask as set forth in claim 1, being a reticle.

4. The mask as set forth in claim 1, wherein said optical shield layer comprises:

a line and space pattern layer having lines each including a first translucent layer and an opaque layer; and an isolated pattern having an isolated line including a second translucent layer.

5. The mask as set forth in claim 1, wherein said optical shield layer comprises:

a line and space pattern layer having lines each including a first translucent layer; and an isolated pattern having an isolated line including a second translucent layer and an opaque layer.

6. A photomask for exposing a photoresist layer on a semiconductor substrate, comprising:

a transparent substrate; and an optical shield layer formed on said transparent substrate, for producing a photographic exposure of an image of a line having a desired width dimension, the width dimension of the image exposed through said mask decreasing with (a) increasing density of neighboring lines (b) increasing transmittance of the shield layer forming said line image, and (c) decreasing thickness of said photoresist layer, the light transmittance of said shield layer being changed in accordance with a thickness of said photoresist layer.

7. The photomask as set forth in claim 6, wherein said optical shield layer comprises:

a first pattern layer including a translucent layer in a first region; and a second pattern including an opaque layer in a second region.

8. The photomask as set forth in claim 6, wherein said optical shield layer comprises:

a first pattern layer including a first translucent layer in a first region; and a second pattern including a second translucent layer and an opaque layer in a second region.

9. The photomask as set forth in claim 6, wherein said optical shield layer comprises:

a first pattern having a first translucent layer and a first opaque layer in a first region;

a second translucent layer in a second region;

a second pattern having a second opaque layer on said second translucent layer.

* * * * *